United States Patent
Castillo, Jr. et al.

(10) Patent No.: US 12,342,492 B2
(45) Date of Patent: Jun. 24, 2025

(54) RACK CABLE ROUTING DEVICE

(71) Applicant: Dell Products L.P., Round Rock, TX (US)

(72) Inventors: Ruben Rolando Castillo, Jr., Converse, TX (US); Neal Beard, Austin, TX (US); Richard A. Reiter, Georgetown, TX (US); Troy Jackson, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 147 days.

(21) Appl. No.: 18/323,649

(22) Filed: May 25, 2023

(65) Prior Publication Data

US 2024/0397659 A1   Nov. 28, 2024

(51) Int. Cl.
*H05K 7/14* (2006.01)
(52) U.S. Cl.
CPC ............... *H05K 7/1491* (2013.01)
(58) Field of Classification Search
CPC .................................. H05K 7/1491
See application file for complete search history.

(56) References Cited

U.S. PATENT DOCUMENTS

| | | | |
|---|---|---|---|
| 9,832,904 B1 * | 11/2017 | Giroux | G02B 6/4452 |
| 9,949,400 B2 * | 4/2018 | Yi | H05K 7/1491 |
| 10,356,932 B2 * | 7/2019 | Chen | H05K 7/1491 |
| 11,556,156 B2 * | 1/2023 | Norton | G06F 1/187 |

* cited by examiner

*Primary Examiner* — Anthony M Haughton
*Assistant Examiner* — Hung Q Dang
(74) *Attorney, Agent, or Firm* — Joseph Mencher

(57) ABSTRACT

A rack cable routing device includes a cable securing base that includes cable securing element(s) that are configured to secure cable(s) to the cable securing base. The rack cable routing device also includes an elongated handle that extends from the cable securing base and that includes an elongated handle distal end that is opposite the elongated handle from the cable securing base. When cable(s) are secured to the cable securing base, the elongated handle may be moved into a computing device rack from a first side of the computing device rack such that the cable securing base is located adjacent a second side of the computing device rack that is opposite the computing device rack from the first side of the computing device rack while the elongated handle distal end of the elongated handle is located adjacent the first side of the computing device rack.

20 Claims, 17 Drawing Sheets

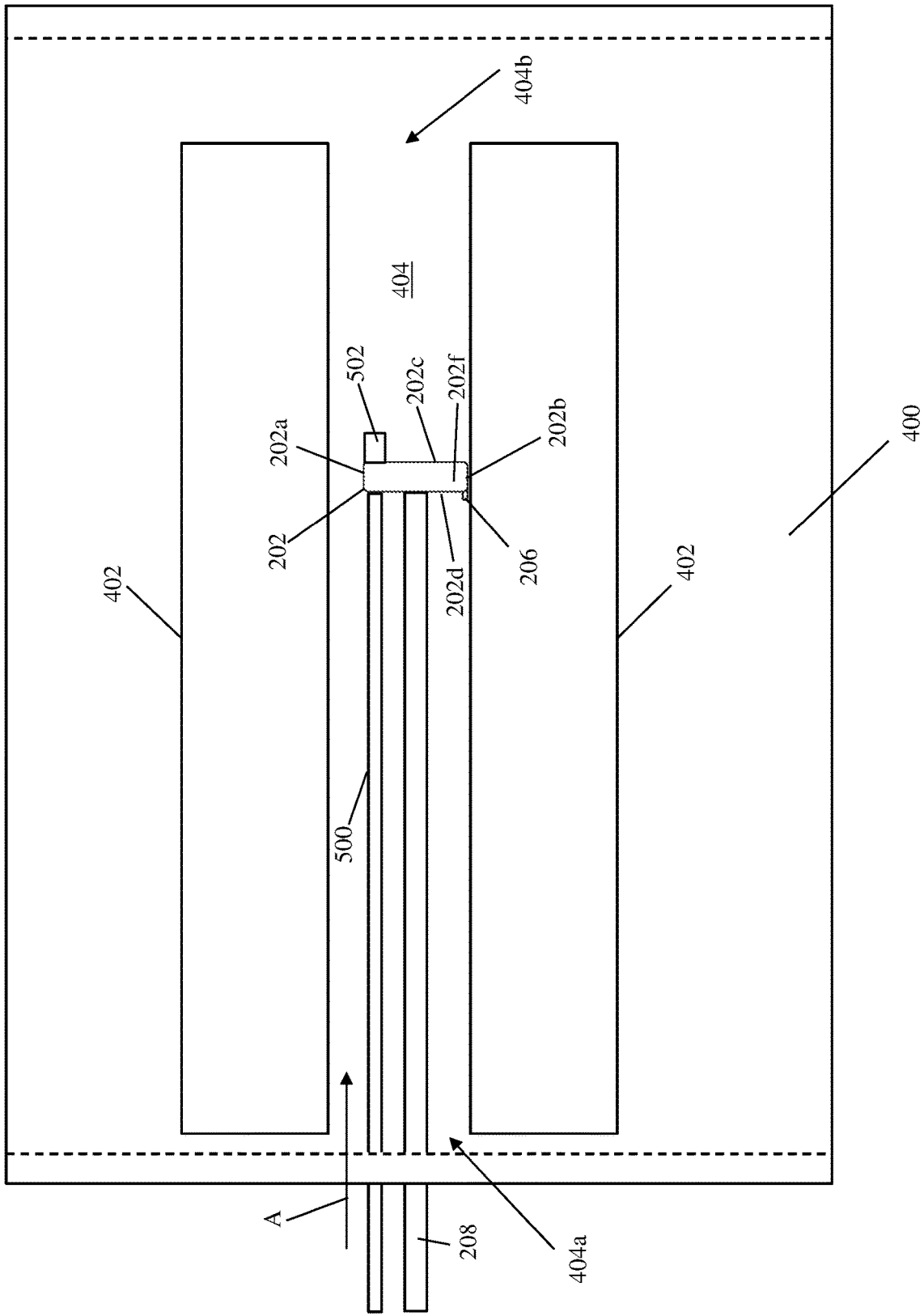

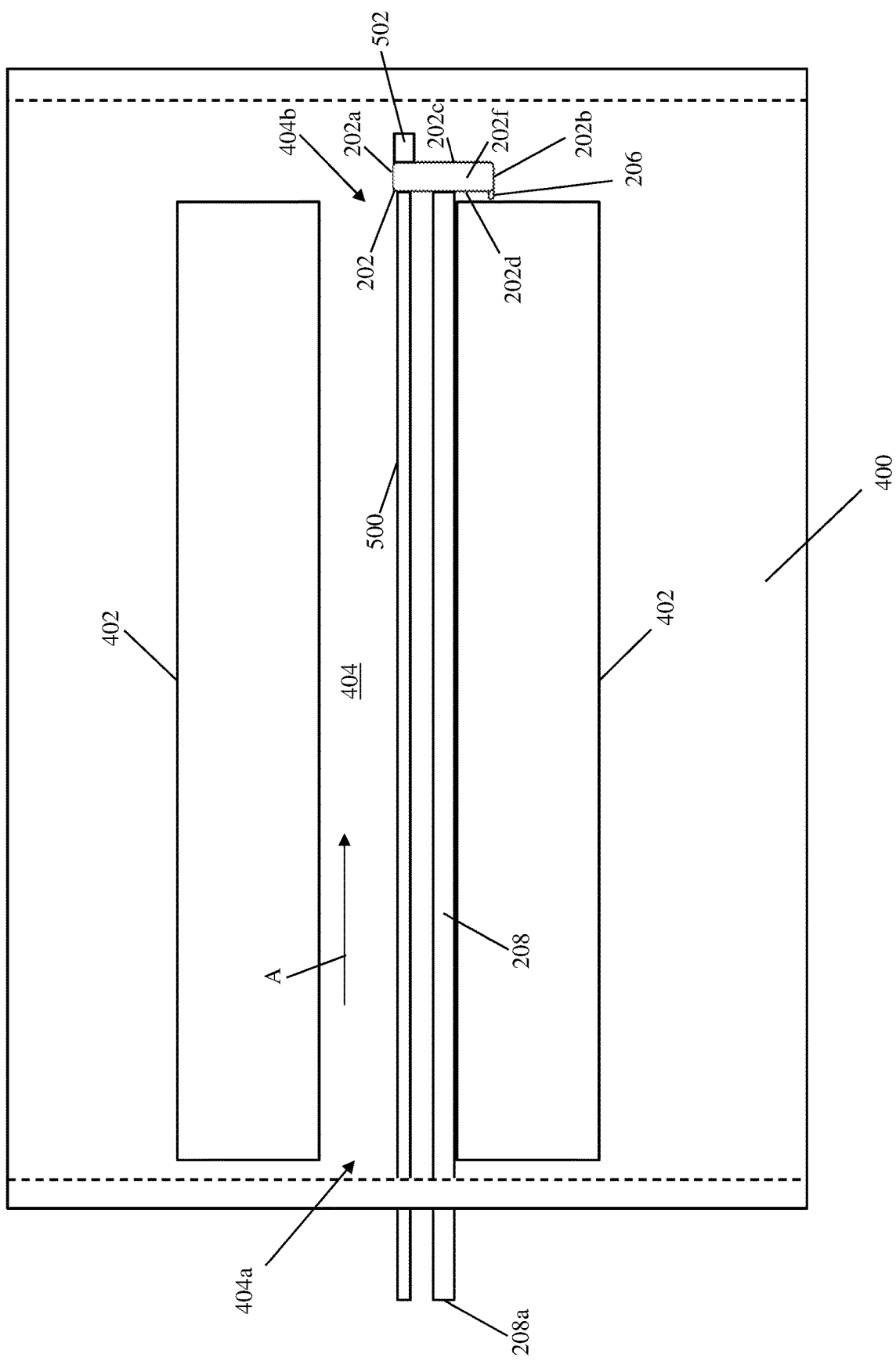

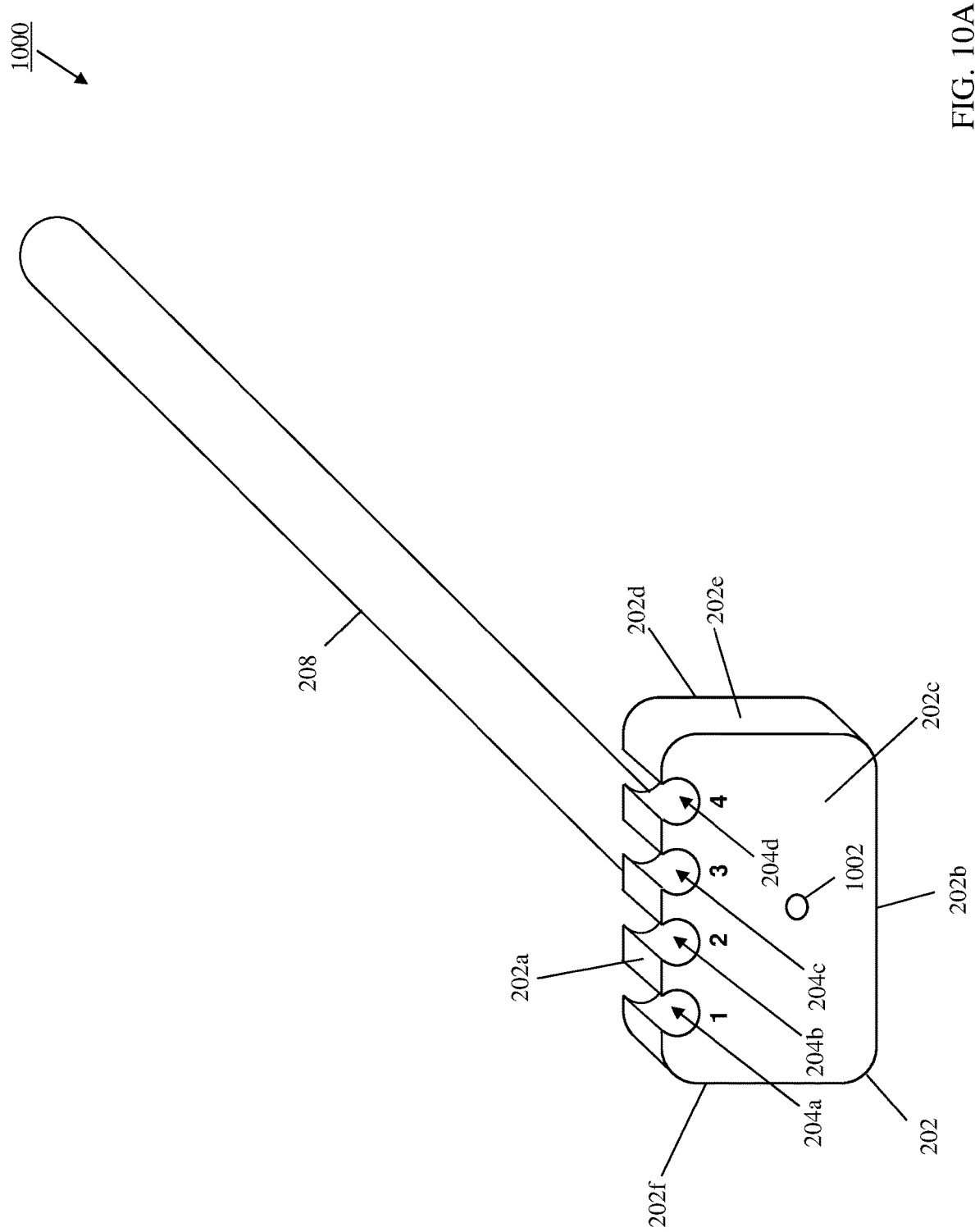

RACK CABLE ROUTING DEVICE

BACKGROUND

The present disclosure relates generally to information handling systems, and more particularly to routing cables in racks that house information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices, storage systems, and/or other computing devices known in the art, are often provided in racks (e.g., in datacenters) and cabled together in order to allow those computing devices to communicate and/or otherwise enable their functionality. In many situations, the cabling of such computing devices requires the routing of cables between the computing devices, which often includes the routing of such cables through the racks that house those computing devices (e.g., between a "front" side and a "back" side of the rack). However, racks housing computing devices will often include limited openings to, and spaces between, the computing devices that often become obstructed by the cables used to cable the computing devices together, and those openings and spaces are sometimes located at heights (e.g., relatively high or low in the rack) that can be difficult for a cabling technician or other user to reach, presenting issues with the physical and visual access required to cable computing devices together in the racks (and between racks).

For example, conventional techniques for cabling computing devices in a rack include the cabling technician or other user "throwing" the cables through the openings and spaces provided in the rack and/or between the computing devices, having a first cabling technician hold the cable(s) and reach through the openings and spaces provided in the rack and/or between the computing devices from a first side of the rack in order to allow a second first cabling technician to grab those cable(s) on a second side of the rack, and/or removing computing devices from the rack to increase the size of the openings and spaces provided in the rack and/or between the computing devices to facilitate the cabling of the computing devices by the cabling technician. As will be appreciated by one of skill in the art in possession of the present disclosure, such conventional rack/computing device cabling techniques are inefficient and/or strenuous for the cabling technicians.

For example, such conventional rack/computing device cabling techniques often required cabling technicians to position themselves in uncomfortable positions for extended amounts of time. Furthermore, when a cabling technician is performing the conventional rack/computing device cabling alone, cables that are being routed through the rack by the cabling technician from a first side of the rack can fall back out of the first side of the rack while the cabling technician is moving to the second side of the rack to finish the routing of those cables (e.g., to connect those cables to ports on computing devices that are located adjacent the second side of the rack). This is particularly problematic with cables that are packaged in "roll" or "loop" that causes them to coil or curl when unpackaged, which in addition to presenting issues such as causing those cables to coil/curl and fall back out of the opening in the rack through which they are being routed, can also cause cable tangling and other issues. The repeated performance of such conventional rack/computing device cabling techniques is often frustrating for cabling technicians or other users and tends to result in increased cabling times. As such, conventional rack/computing device cabling is often performed by a pair of cabling technicians, thus increasing the cost of performing such cabling while only addressing some of the issues described above.

Accordingly, it would be desirable to provide a rack cable routing system that addresses the issues discussed above.

SUMMARY

According to one embodiment, an Information Handling System (IHS) includes a computing device rack that includes a first side and a second side that is opposite the computing device rack from the first side; a plurality of computing devices that are positioned in the computing device rack; and a rack cable routing device that includes: a cable securing base that includes at least one cable securing element that is configured to secure at least one cable to the cable securing base; and an elongated handle that extends from the cable securing base and that includes an elongated handle distal end that is opposite the elongated handle from the cable securing base, wherein the elongated handle is configured, while at least one cable is secured to the cable securing base, to be moved into the computing device rack from the first side of the computing device rack such that the cable securing base is located adjacent the second side of the computing device rack while the elongated handle distal end of the elongated handle is located adjacent the first side of the computing device rack.

BRIEF DESCRIPTION OF THE DRAWINGS

FIG. 6B is a side view illustrating an embodiment of cables being routed through the rack of FIGS. 4A and 4B using the rack cable routing device of FIGS. 2A and 2B during the method of FIG. 3.

FIG. 7A is a side view illustrating an embodiment of cables being routed through the rack of FIGS. 4A and 4B using the rack cable routing device of FIGS. 2A and 2B during the method of FIG. 3.

FIG. 10A is a perspective view illustrating an embodiment of a rack cable routing device provided according to the teachings of the present disclosure.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
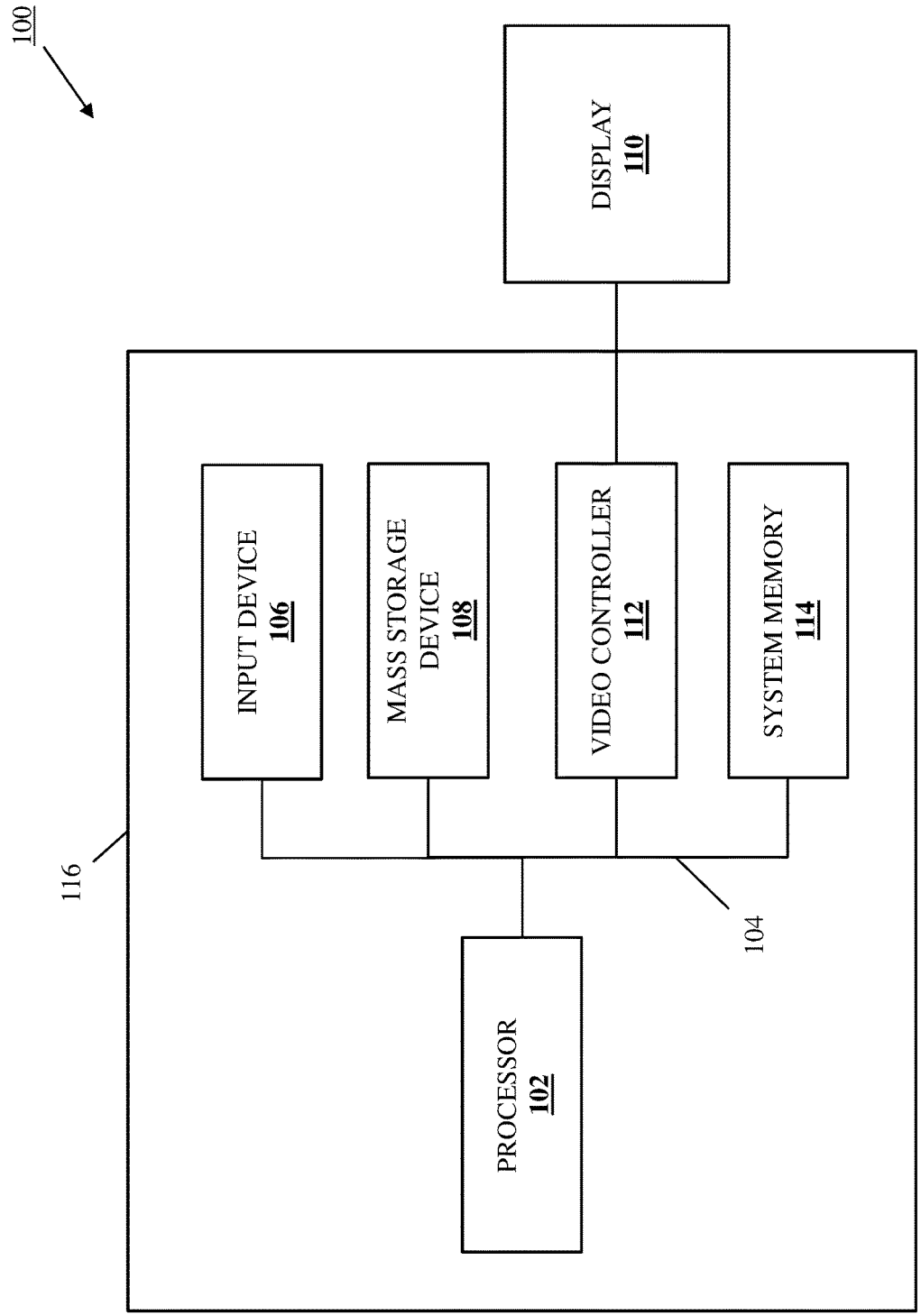
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
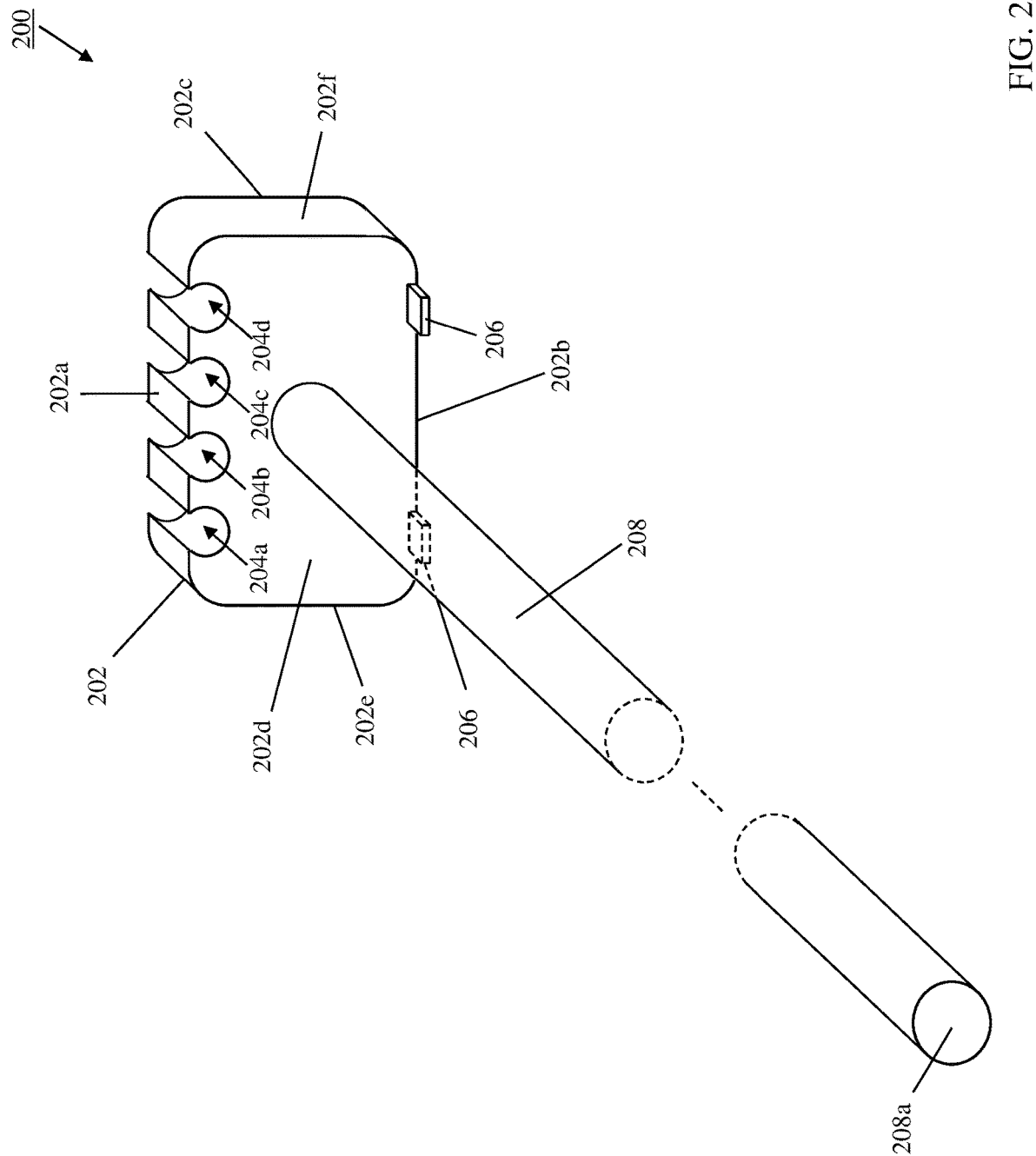
FIG. 2A is a perspective view illustrating an embodiment of a rack cable routing device provided according to the teachings of the present disclosure.
Figure 2B:
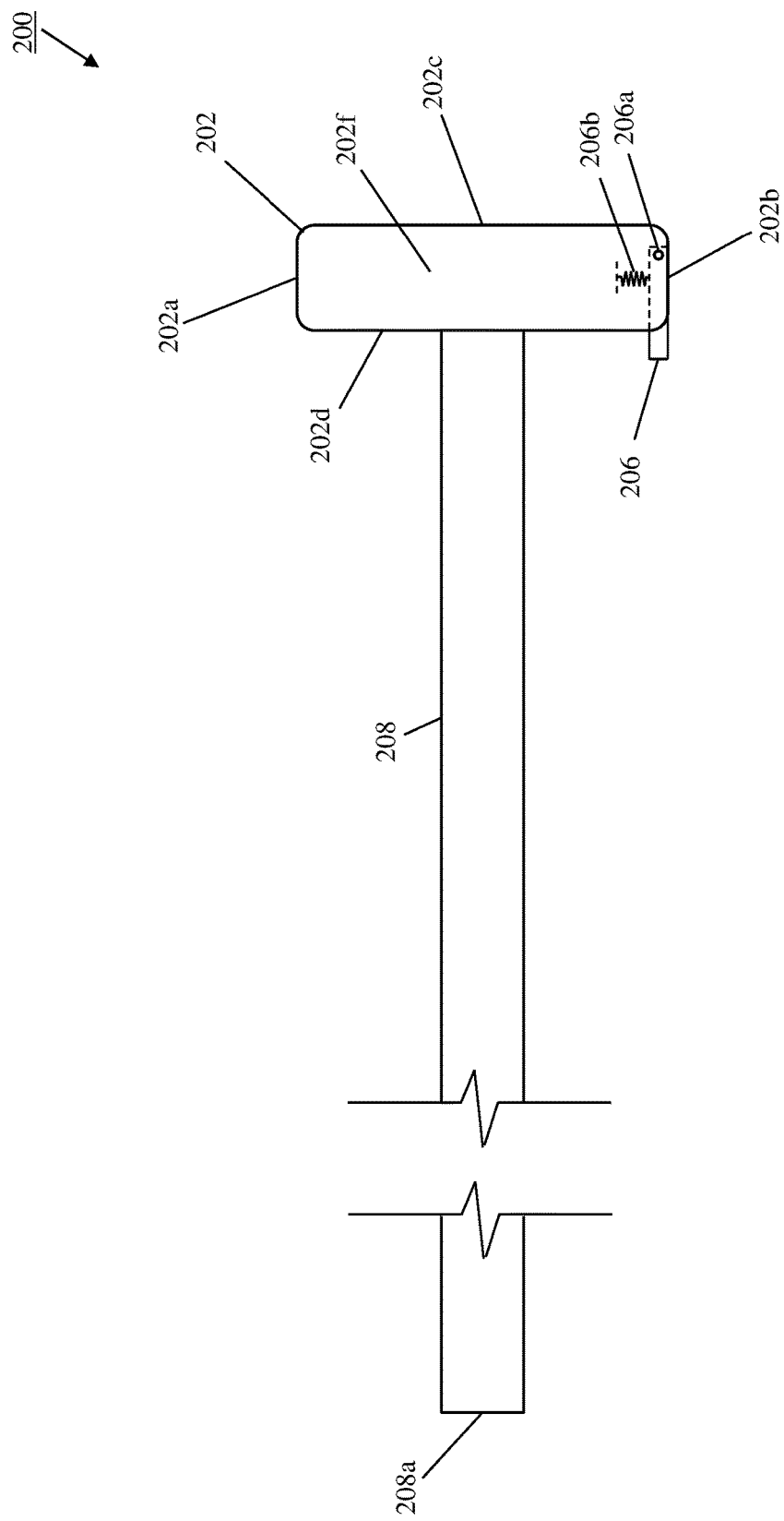
FIG. 2B is a side view illustrating an embodiment of the rack cable routing device of FIG. 2A.

Referring now to FIGS. 2A and 2B, an embodiment of a rack cable routing device 200 provided according to the teachings of the present disclosure is illustrated. In the illustrated embodiment, the rack cable routing device 200 includes a cable securing base 202 having a top surface 202a, a bottom surface 202b that is located opposite the cable securing base 202 from the top surface 202a, a front surface 202c that extends between the top surface 202a and the bottom surface 202b, a rear surface 202d that extends between the top surface 202a and the bottom surface 202b and that is located opposite the cable securing base 202 from the front surface 202c, and a pair of opposing side surfaces 202e and 202f that extend between the top surface 202a, the bottom surface 202b, the front surface 202c, and the rear surface 202d, and that are located opposite the cable securing base 202 from each other.

The cable securing base 202 includes a plurality of cable securing elements that, as discussed below, are configured to secure respective cables to the cable securing base 202. In the illustrated embodiment, each of the cable securing elements are provided by respective cable securing channels 204a, 204b, 204c, and 204d that are defined by the cable securing base 202 between its front surface 202c and rear surface 202d and that each include a respective cable securing channel entrance defined by its top surface 202a. As discussed below, in some examples embodiments of the present disclosure may provide the cable securing base 202 using a relatively "hard" or "rigid" material such as a plastic or metal material that requires cables to be "pushed" through the cable securing channel entrances on the cable securing channels 204a-204d in order to be secured to the cable securing base 202 in the cable securing channels 204a-204d. However, other embodiments of the present disclosure may provide the cable securing base 202 using a relatively "soft" or "flexible" material such as a foam or rubber material that may include "cuts" or other features that allow the cable securing base 202 to move around cables to secure those cables on the cable securing base 202 in cable securing channels that operate similarly to the cable securing channels 204a-204d described below. However, while the illustrated embodiments include 4 cable securing elements provided by particular cable securing channels, one of skill in the art in possession of the present disclosure will appreciate how any number of any of a variety of types of cable securing elements that use any of a variety of techniques for securing cables to the cable securing base 202 may be provided on the cable securing base 202 while remaining within the scope of the present disclosure as well.

In the illustrated embodiment, a plurality of retaining members 206 are included on the cable securing base 202 in a spaced apart orientation on its bottom surface 202b and adjacent its side surfaces 202e and 202f. As discussed below, in some embodiments the retaining members 206 may be resiliently coupled to the cable securing base 202, and the illustrated embodiment provides each of the retaining members 206 with a pivotal coupling 206a that allows its retaining member 206 to rotate about that pivotal coupling 206a relative to the cable securing base 202, along with a spring 206b that is coupled to that retaining member 206 and the cable securing base 202 in order to resiliently bias that retaining member 206 into a non-retaining orientation that is illustrated in FIGS. 2A and 2B. However, other embodiments of the present disclosure may allow the retaining members 206 to move between the non-retaining orientation and the retaining orientations described below via gravity, may omit the retaining members 206 and use the rear surface 202d of the cable securing base 202 to perform the retaining functionality described below, and/or may provide the retraining functionality using other techniques that would be apparent to one of skill in the art in possession of the present disclosure.

In the illustrated embodiment, an elongated handle 208 extends from a substantially central location on the rear surface 202d on the cable securing base 202, and includes an elongated handle distal end 208a that is located opposite the elongated handle 208 from the cable securing base 202. As described below, the elongated handle 208 may include a length that is configured to allow the elongated handle distal end 208a to be held adjacent the first side of a computing device rack while the elongated handle 208 extends through that computing device rack such that the cable securing base 202 is positioned adjacent a second side of that computing device rack that is opposite the computing device rack from the first side. For example, the length of the elongated handle 208 may allow a cabling technician to hold the elongated handle 208 adjacent its elongated handle distal end 208a such that the elongated handle distal end 208a is located outside the rack adjacent a first side of the rack while the elongated handle 208 extends through the rack such that the cable securing base 202 extends out of a second side of the rack that is opposite the first side of the rack.

However, embodiments in which the length of the elongated handle 208 requires the a cabling technician to hold the elongated handle 208 adjacent its elongated handle distal end 208a such that the elongated handle distal end 208a is located inside the rack immediately adjacent the first side of the rack while the elongated handle 208 extends through the rack, and/or embodiments in which the length of the elongated handle 208 results in the cable securing base 202 being located inside the rack immediately adjacent the second side of the rack that is opposite the first side of the rack when the elongated handle 208 is extended through the rack, will fall within the scope of the present disclosure as well. In experimental embodiments, the elongated handle 208 was provided with a length of approximately 40 inches for use with conventional depth racks, although one of skill in the art in possession of the present disclosure will appreciate how a variety of elongated handle lengths that are based on the depth of a rack used with the rack cable routing devi will fall within the scope of the present disclosure.

Furthermore, some embodiments of the present disclosure may provide an elongated handle 208 that is configured to adjust in length. For example, the elongated handle 208 may include a "telescoping" configuration (e.g., with the elongated handle provided with different diameter cylindrical portions that are configured to move into and out of each other) that provides the elongated handle 208 a "telescoping" functionality that allows the length of the elongated handle 208 to change, as well as a locking mechanism that allows the length of the elongated handle 208 to be set/prevented from changing when being used to route cables through a rack. However, while a particular technique for changing the length of the elongated handle 208 has been described, one of skill in the art in possession of the present disclosure will appreciate how other techniques for providing an adjustable length elongated handle will fall within the scope of the present disclosure as well. Furthermore, while a specific rack cable routing device 200 has been illustrated and described, one of skill in the art in possession of the present disclosure will appreciate the rack cable routing device of the present disclosure may include a variety of components and/or component configurations (only a few of which are detailed below) that will fall within the scope of the present disclosure as well.

Figure 3:
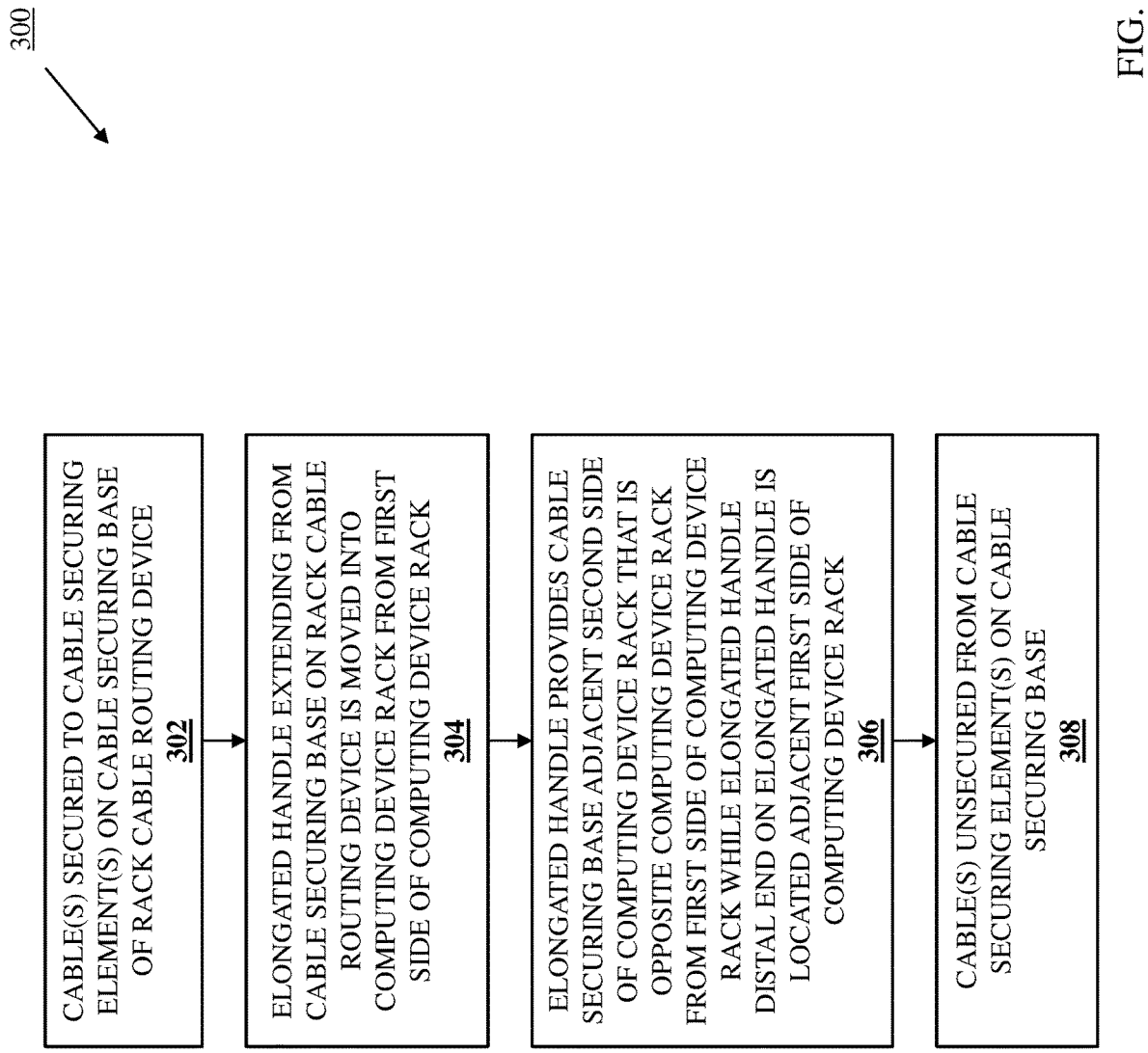
FIG. 3 is a flow chart illustrating an embodiment of a method for routing cables through a rack.

Referring now to FIG. 3, an embodiment of a method 300 for routing cables through a computing device rack is illustrated. As discussed below, the systems and methods of the present disclosure provide a rack cable routing device that secures cables to one of its ends while allowing its other end to be utilized to push those cables through a rack from a first side of the rack to a second side of the rack, with the rack cable routing device configured to hold the cable securing base and cables secured thereto in place on the second side of the rack so that they may be unsecured from the rack cable routing device and connected to computing devices in the rack. For example, the rack cable routing device of the present disclosure may include a cable securing base that includes cable securing element(s) that are configured to secure cable(s) to the cable securing base. The rack cable routing device also includes an elongated handle that extends from the cable securing base and that includes an elongated handle distal end that is opposite the elongated handle from the cable securing base. When cable(s) are secured to the cable securing base, the elongated handle may be moved into a computing device rack from a first side of the computing device rack such that the cable securing base is located adjacent a second side of the computing device rack that is opposite the computing device rack from the first side of the computing device rack while the elongated handle distal end of the elongated handle is located adjacent the first side of the computing device rack. As such, a single cabling technician may route cables through a rack without the issues associated with conventional rack cable routing techniques described above.

Figure 4A:
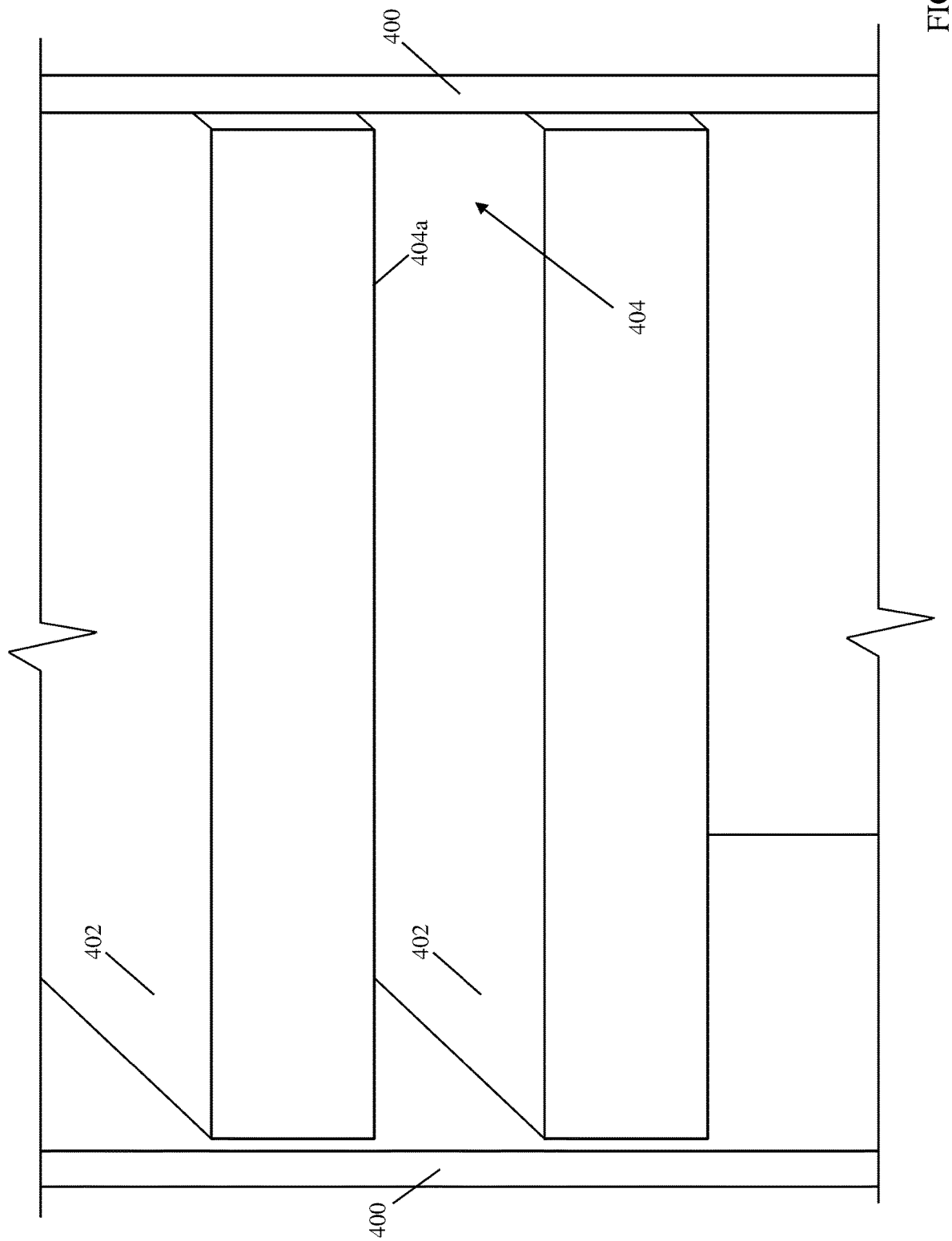
FIG. 4A is a perspective view illustrating an embodiment of computing devices positioned in a rack.
Figure 4B:
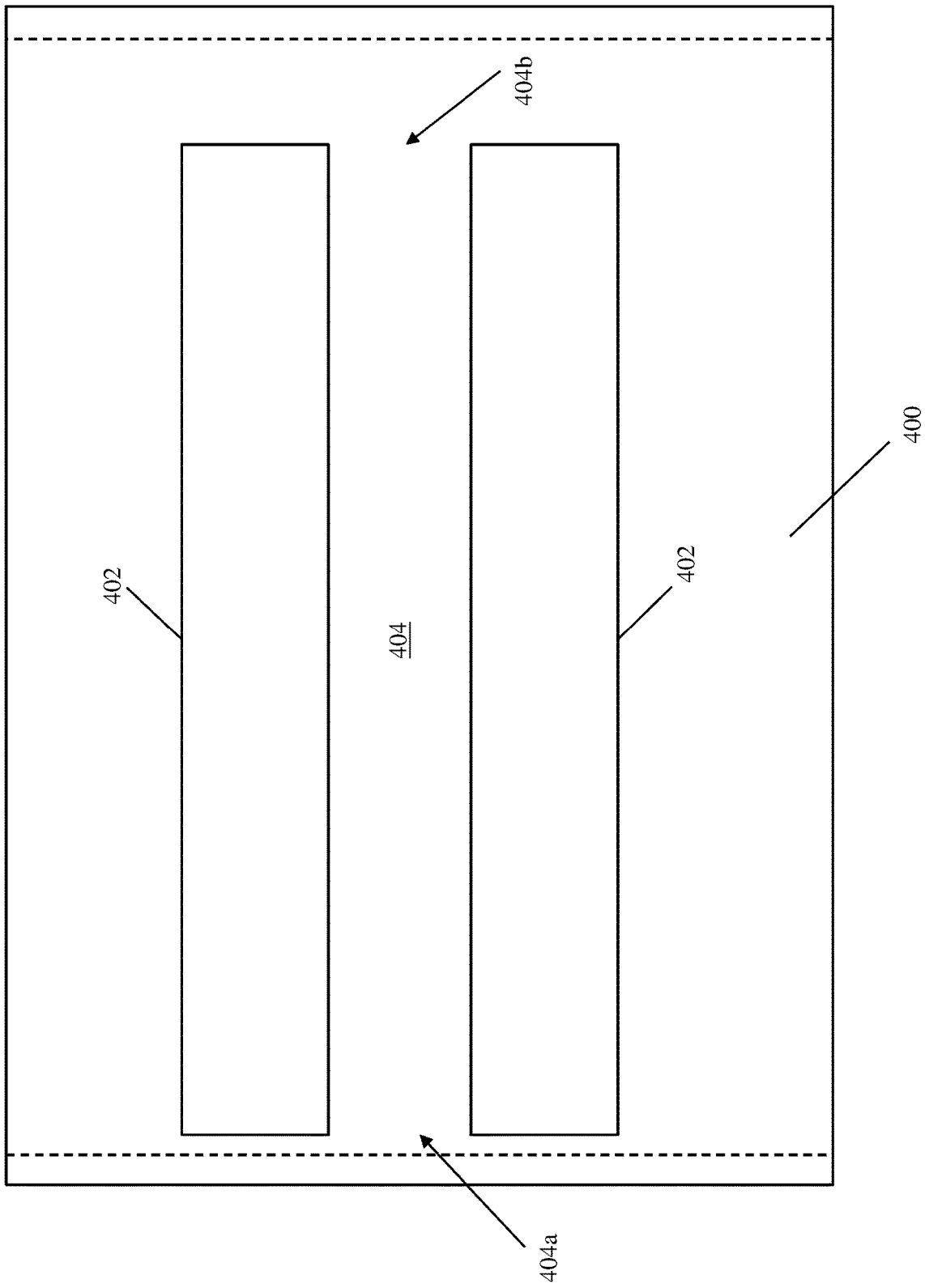
FIG. 4B is a side view illustrating an embodiment the computing devices positioned in the rack of FIG. 4A.

With reference to FIGS. 4A and 4B, an embodiment of a rack that houses computing devices and that may be utilized with the rack cable routing device of the present disclosure is illustrated. In the illustrated embodiment, the rack includes a plurality of spaced apart walls 400 that may include shelves, tracks, rails, and/or other computing device coupling/securing features that one of skill in the art in possession of the present disclosure would recognize as coupling and/or securing computing devices to the rack as described herein. For example, the embodiments illustrated and discussed below include a pair of computing devices 402 that are positioned in the rack adjacent each other (e.g., via engagement with the computing device coupling/securing features on the walls 400 of the rack discussed above) such that a space 404 including an entrance 404a and an exit 404b is defined between the computing devices 402.

While not illustrated in FIGS. 4A and 4B, one of skill in the art in possession of the present disclosure will appreciate how a plurality of other computing devices (other than the computing devices 402 illustrated in FIGS. 4A and 4B) may be located in the rack and may be cabled together with cables that may be routed through the space 404 between the computing devices 402 and/or immediately adjacent the entrance 404a and/or exit 404b of the space 404 between computing devices 402 such that physical and/or visual access to the space 404 and/or its entrance 404a and/or exit 404b is obstructed. However, while a specific rack housing computing devices has been illustrated and described, one of skill in the art in possession of the present disclosure will appreciate how a variety of racks may house computing devices in a variety of manners that will fall within the scope of the present disclosure as well.

Figure 5:
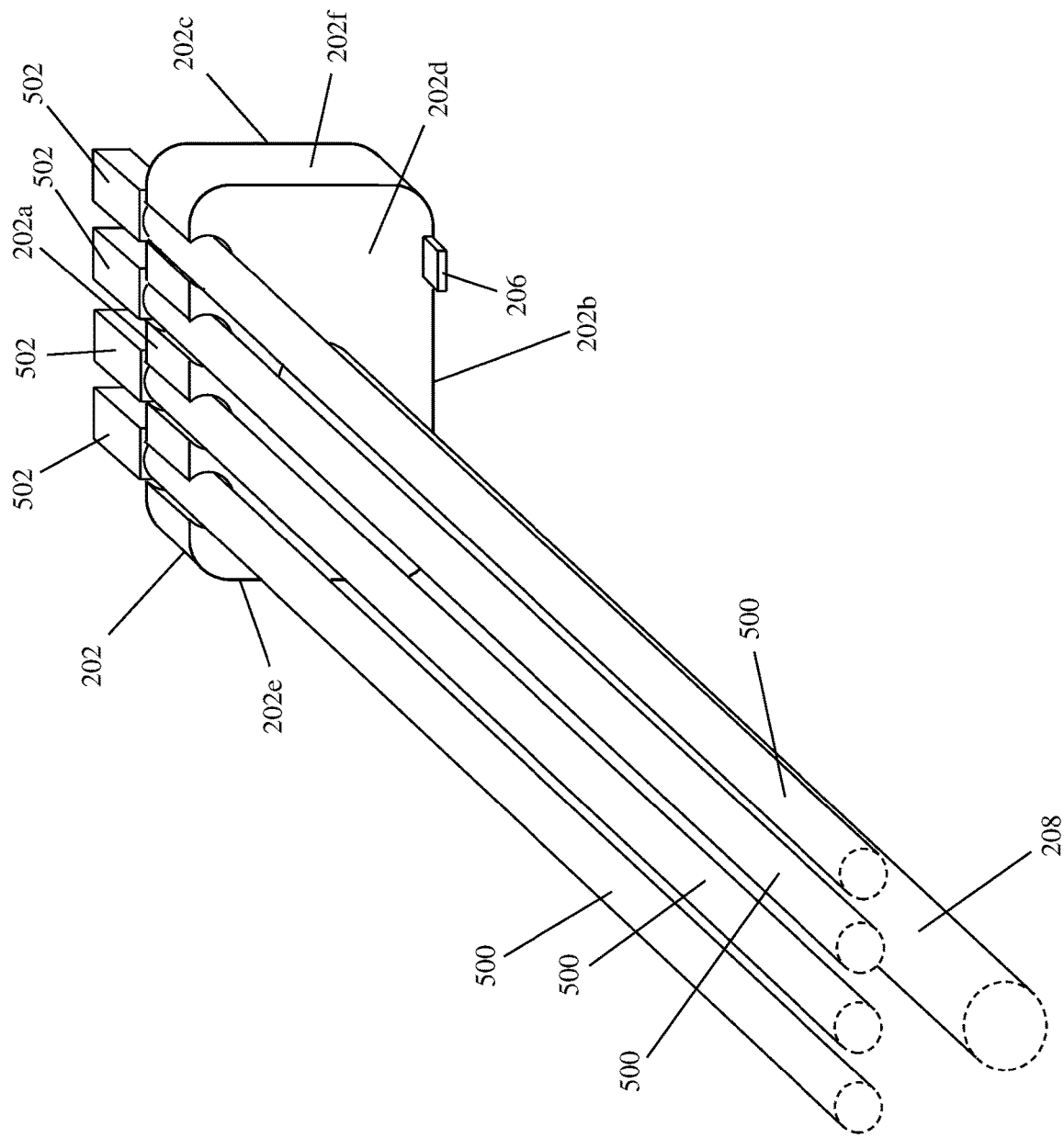
FIG. 5 is a perspective view illustrating an embodiment of cables connected to the rack cable routing device of FIGS. 2A and 2B during the method of FIG. 3.

The method 300 begins at block 302 where one or more cables are secured to one or more cable securing elements on a cable securing base of a rack cable routing device. With reference to FIG. 5, in an embodiment of block 302, a plurality of cables 500 each including a respective cable connector 502 may be provided, and each of those cables 500 may be secured to the cable securing base 202 on the rack cable routing device 200 by moving each of those cable 500 through the cable securing channel entrance on one of the cable securing channels 204a-204d such that that cable 500 becomes positioned in that cable securing channel with the cable connector 502 on each cable 500 located adjacent the front surface 202c of the cable securing base 202 while that cable 500 extends from the rear surface 202d of the cable securing base 202 (e.g., with each of the cables 500 secured to the cable securing base 202 extending along at least a portion of the length of the elongated handle 208 in the illustrated embodiment).

As will be appreciated by one of skill in the art in possession of the present disclosure, the cable securing channel entrance on each of the cable securing channels 204a-204d may be dimensioned such that cables 500 must be "pushed" through the cable securing channel entrance on that cable securing channel, and such that the cable securing channel entrance on that cable securing channel resists movement of the cables 500 out of that cable securing channel (e.g., the width of the cable securing channel entrance on each cable securing channel 204a-204d may be smaller than a diameter of the cables 500 such that the cables 500 must be deformed to enter and exit the cable securing channels 204a-204d via their cable securing channel entrances).

In a specific example, each of the cables 500 illustrated in FIG. 5 may include a cable connector (not visible in FIG. 5) that is located opposite that cable 500 from the cable connector 502 and that is coupled to a computing device (not visible in FIG. 5) that may be located in the rack with the computing devices 402 or outside that rack, and a cabling technician may secure those cables 500 to the card securing base 202 on the rack cable routing device 200 at block 302 in order to route those cables 500 through the space 404 between the computing devices 402 (e.g., to connect the cable connector 502 on at least one of those cables 500 to one of the computing devices 402, to connect the cable connector 502 on at least one of those cables 500 to other computing device(s) in the rack that houses the computing devices 402, etc.).

To provide a specific example, the cable connectors 502 on the cables 500 illustrated in FIG. 5 may be connected to ports on a management switch device (not visible) that is located in the rack that houses the computing devices 402 such that those ports are accessible on a "rear" side of the rack, and a cabling technician may secure those cables 500 to the card securing base 202 on the rack cable routing device 200 at block 302 in order to route those cables 500 from the "rear" side of the rack and through the space 404 between the computing devices 402 to connect the cable connector 502 on those cables 500 to port(s) on at least one of the computing devices 402 that are accessible on a "front" side of the rack that is opposite the rack form the "rear" side. However, while specific reasons for securing cables to the cable securing base 202 on the rack cable routing device 200 have been described, one of skill in the art in possession of the present disclosure will appreciate how cables may be secured to the cable securing base 202 on the rack cable routing device 200 for routing those cables for a variety of reasons that will fall within the scope of the present disclosure as well.

Figure 6A:
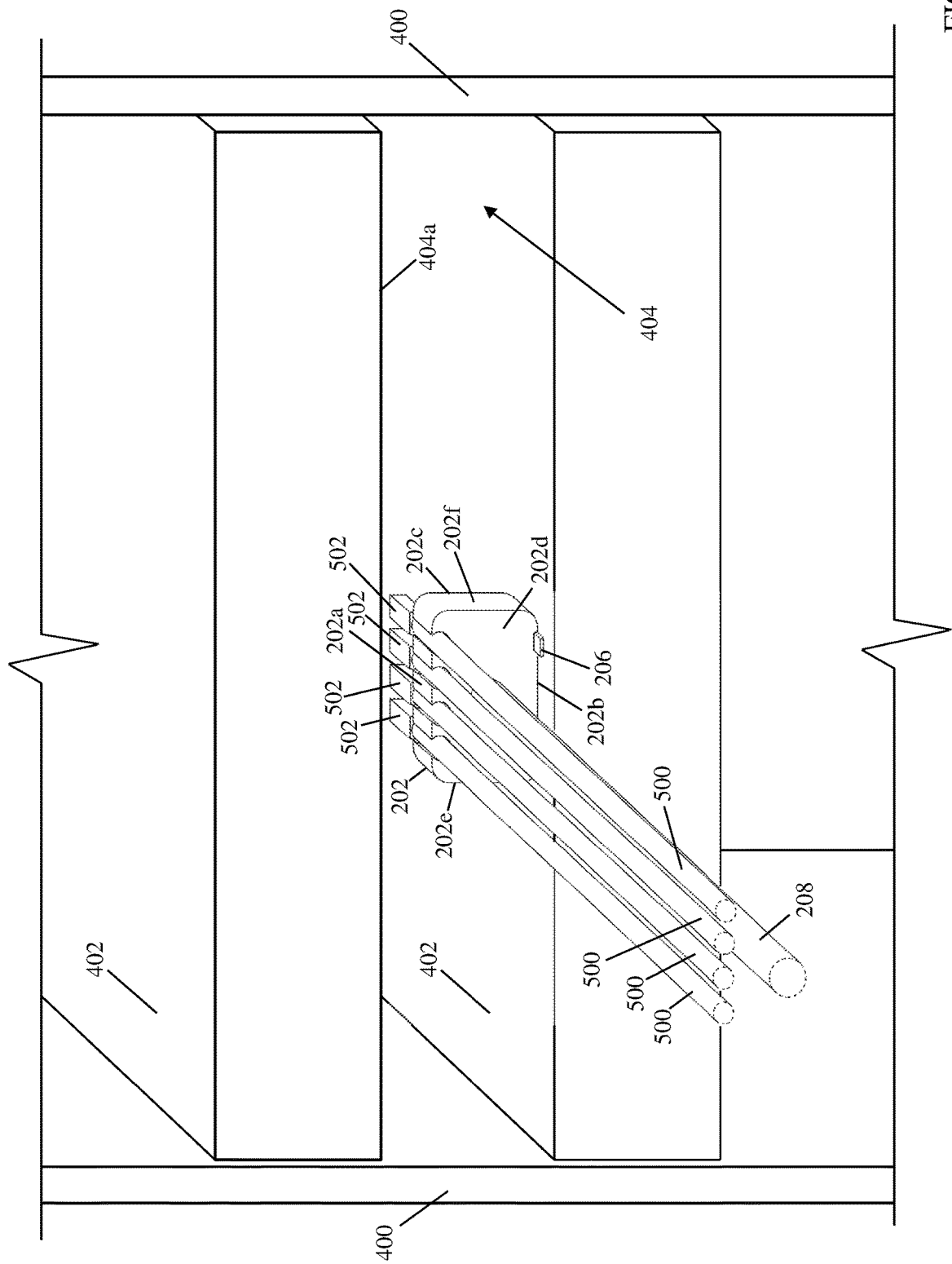
FIG. 6A is a perspective view illustrating an embodiment of cables being routed through the rack of FIGS. 4A and 4B using the rack cable routing device of FIGS. 2A and 2B during the method of FIG. 3.

The method 300 then proceeds to block 304 where an elongated handle extending from the cable securing base of the rack cable routing device is moved into a computing device rack from a first side of the computing device rack. With reference to FIG. 6A, in an embodiment of block 304, the cabling technician may grasp the elongated handle 208 of the rack cable routing device 200 adjacent its elongated handle distal end 208a, and may position the cable securing base 202 adjacent the rack such that the front surface 202c of the cable securing base 202 is located adjacent the entrance 404a of the space 404 between the computing devices 402 in the rack. With reference to FIG. 4B, the cabling technician may then move the elongated handle 208 of the rack cable routing device 200 in a direction A such that the cable securing base 202 moves through the entrance 404a of the space 404 between the computing devices 402 and into the space 404 between the computing devices 402. As will be appreciated by one of skill in the art in possession of the present disclosure, the cabling technician may need to find/make an "opening" between cables that obstruct the physical and/or visual access to the entrance 404a and/or space 404 between the computing devices 402, and once the cable securing base 202 on the rack cable routing device 200 moves through the entrance 404a and into the space 404 between the computing devices 402, the bottom surface 202b of the cable securing base 202 may be rested on a top surface of the computing device 402 and slid along that top surface and through the space 404 between the computing devices 402 (e.g., in embodiments in which that portion of the top surface of the computing device 402 is clear).

The method 300 then proceeds to block 306 where the elongated handle provides the cable securing base adjacent a second side of the computing device rack that is opposite the computing device rack from the first side of the computing device rack while an elongated handle distal end on the elongated handle is located adjacent the first side of the computing device rack. With reference to FIG. 7A, in an embodiment of block 306, the cabling technician may continue to move the elongated handle 208 of the rack cable routing device 200 in the direction A such that the cable securing base 202 moves through the space 404 between the computing devices 402 until it moves past the exit 404b of the space 404 between the computing devices 402. In the specific example illustrated in FIG. 7A, movement of the cable securing base 202 past the exit 404b of the space 404 between the computing devices 402 allows the elongated handle 208 on the rack cable routing device 200 to engage the top surface of the computing device 402 and the rear surface 202d of the card securing base 202 to engage the back surface of the computing device 402, and in some embodiments the engagement of the rear surface 202d of the card securing back 202 with the back surface of the computing device 402 may provide the retaining functionality discussed below that resists movement of the card securing base 202 back through the exit 404b of the space 404 between the computing devices 402 (i.e., back into the space 404 between the computing devices 402).

Figure 7B:
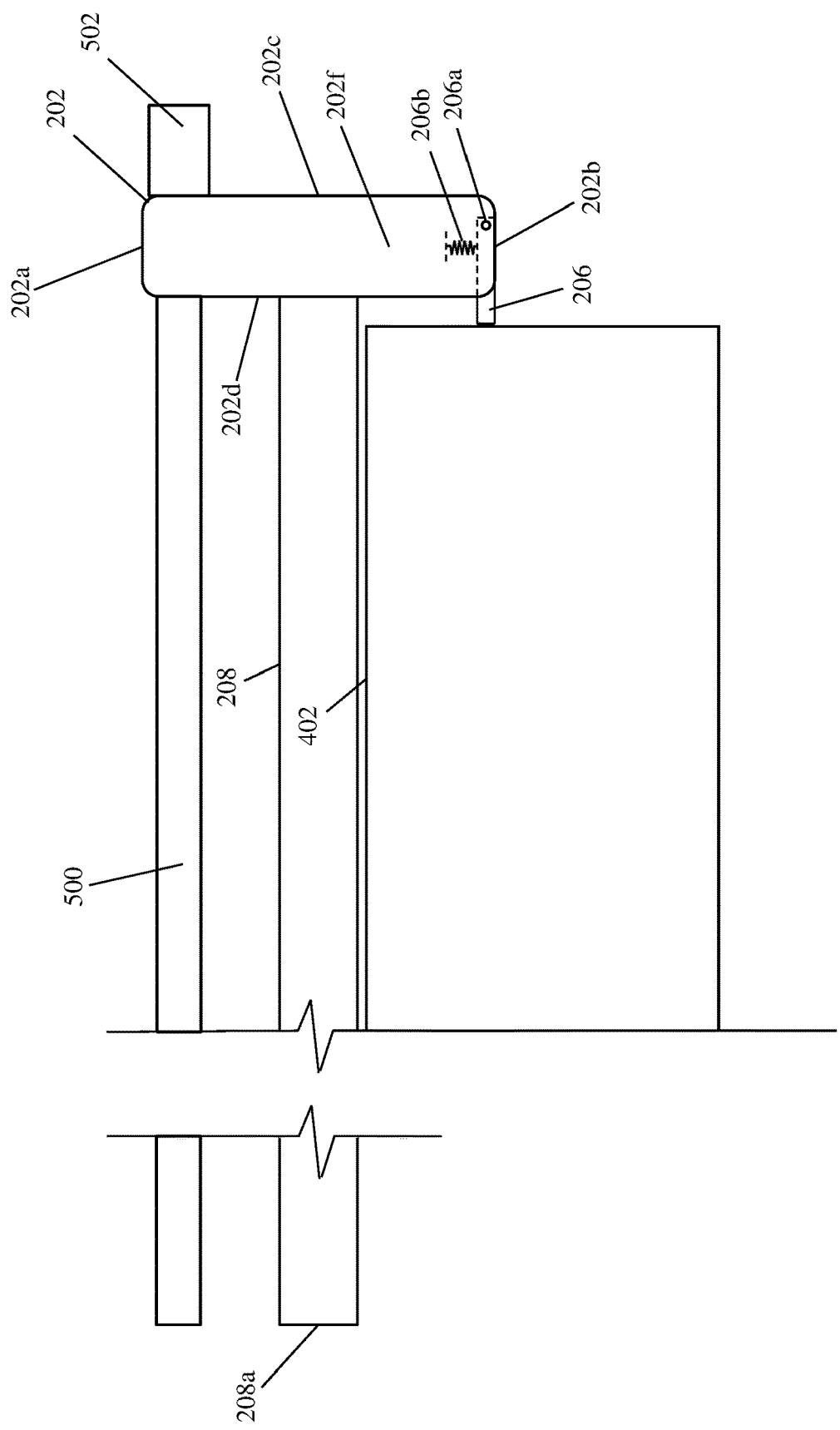
FIG. 7B is a side view illustrating an embodiment of cables being routed through the rack of FIGS. 4A and 4B using the rack cable routing device of FIGS. 2A and 2B during the method of FIG. 3.
Figure 7C:
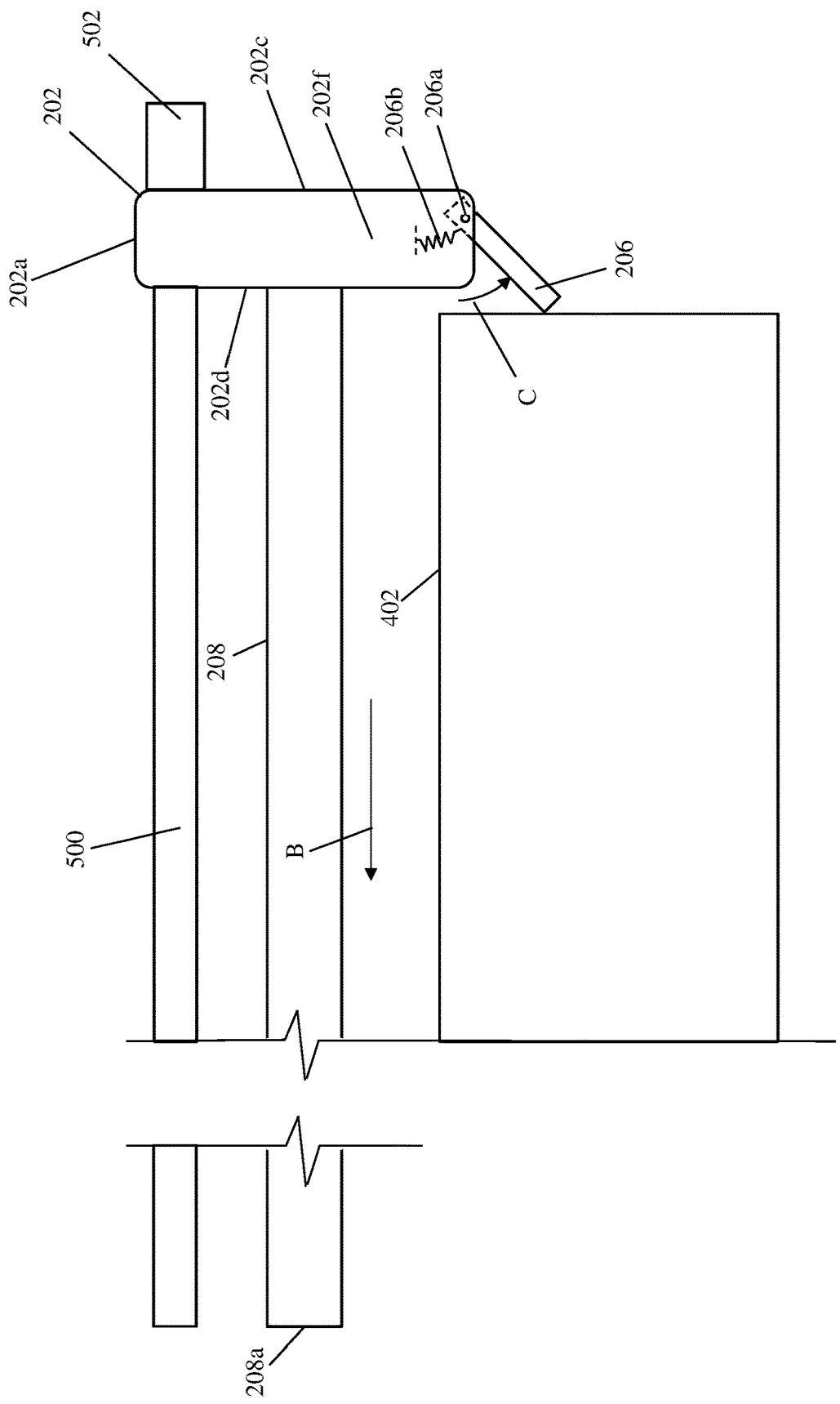
FIG. 7C is a side view illustrating an embodiment of cables being routed through the rack of FIGS. 4A and 4B using the rack cable routing device of FIGS. 2A and 2B during the method of FIG. 3.
Figure 7D:
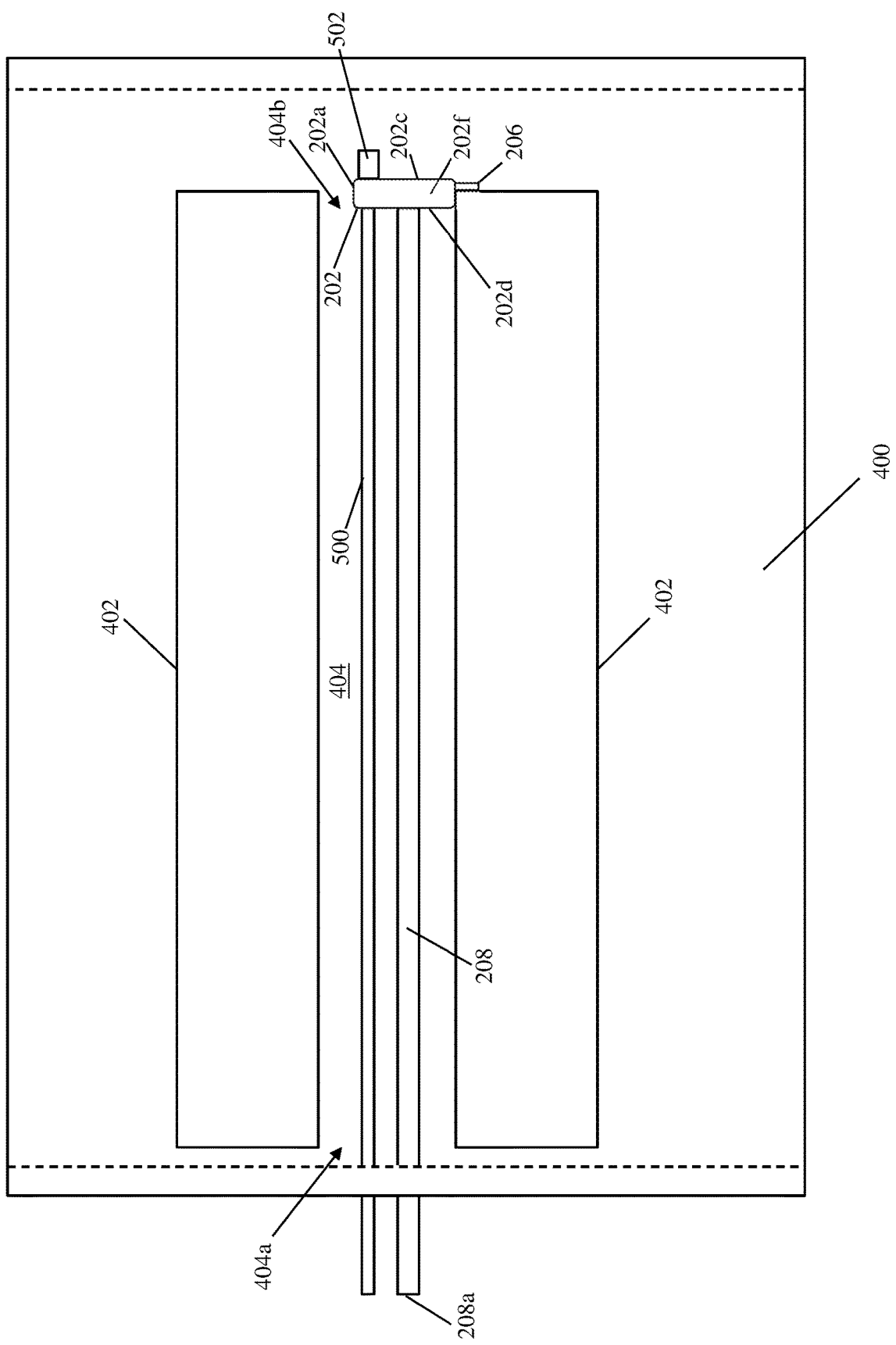
FIG. 7D is a side view illustrating an embodiment of cables being routed through the rack of FIGS. 4A and 4B using the rack cable routing device of FIGS. 2A and 2B during the method of FIG. 3.

However, in some embodiments, the retaining members 206 may be activated to resist movement of the card securing base 202 back through the exit 404b of the space 404 between the computing devices 402 (i.e., back into the space 404 between the computing devices 402). For example, as illustrated in FIGS. 7B and 7C, movement of the cable securing base 202 past the exit 404b of the space 404 between the computing devices 402 may cause the retaining members 206 to engage the back surface of the computing device 402, and the cable technician may then move the elongated handle 208 on the rack cable routing device 200 in a direction B in order to cause the retaining members 206 to overcome the resilient biasing by the spring 206b and rotate about the pivotal coupling 206a in a direction C. As illustrated in FIG. 7D, continued movement of the elongated handle 208 on the rack cable routing device 200 in the direction B will cause the retaining members 206 to continue to rotate about the pivotal coupling 206a in the direction C and into a retaining orientation that is rotated substantially 90 degrees from the non-retaining orientation of the retaining members 206 discussed above. However, while a few specific examples have preventing movement of the card securing base 202 (and thus the cables 500 secured thereto) back through the exit 404b and the space 404 between the computing devices 402, one of skill in the art in possession of the present disclosure will appreciate how other techniques for preventing such movement will fall within the scope of the present disclosure as well.

Figure 8:
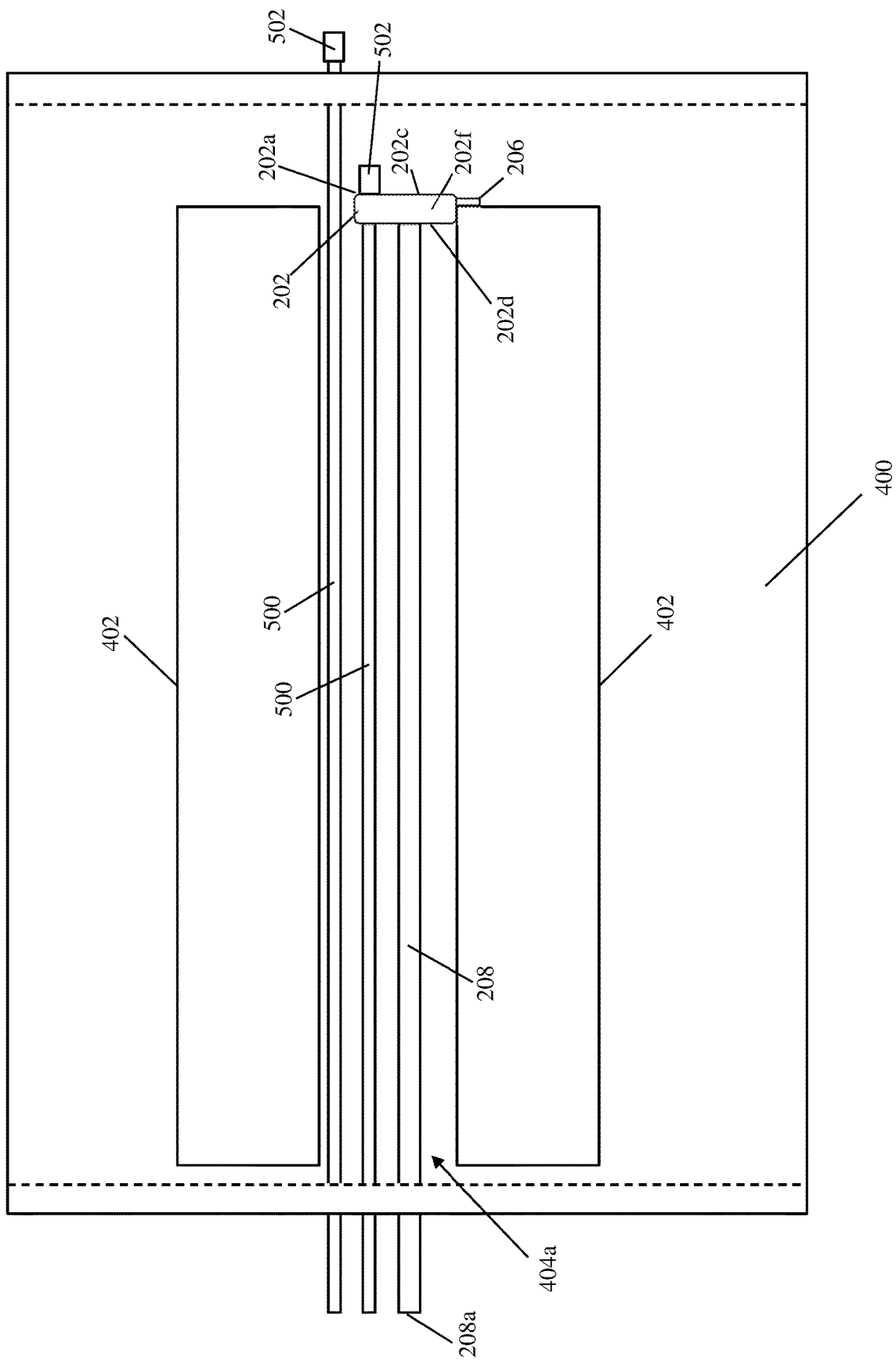
FIG. 8 is a side view illustrating an embodiment of cables being routed through the rack of FIGS. 4A and 4B using the rack cable routing device of FIGS. 2A and 2B during the method of FIG. 3.

The method 300 then proceeds to block 308 where the one or more cables are unsecured from the one or more cable securing elements on the cable securing base. With reference to FIG. 8, in an embodiment of block 308, a cable 500 may be unsecured from the cable securing base 202. Continuing with the specific example provided above, the cable 500 may be "pulled" through the cable securing channel entrance of the cable securing channel 204a-204d on the card securing base 202 that secured it (e.g., the cable 500 may be deformed to exit that cable securing channels 204a-204d via its cable securing channel entrance). Once unsecured from the cable securing base 202 on the rack cable routing device 200, the cable connector 502 on the cable 500 may be connected to one of the computing devices 402, another computing device in the rack that houses the computing devices 402, and/or to any other computing device that would be apparent to one of skill in the art in possession of the present disclosure. The cabling technician may then use the elongated handle 208 on the rack cable routing device 200 to move the cable securing base 202 back through the exit 404b of the space 404 between the computing devices 402 (e.g., by lifting the elongated handle 208 and the card securing base 202 such that the retaining members 206 are resiliently biased back into their non-retaining orientation, and then moving the elongated handle 208 and the card securing base 202 in the direction B discussed with reference to FIG. 7C), allowing the rack cable routing device 200 to be moved through the space 404 between the computing devices 402 and out of the entrance 404a of the space 404 between the computing devices 402 (e.g., in a direction opposite the direction A discussed above with reference to FIGS. 6B and 7A).

Figure 9:
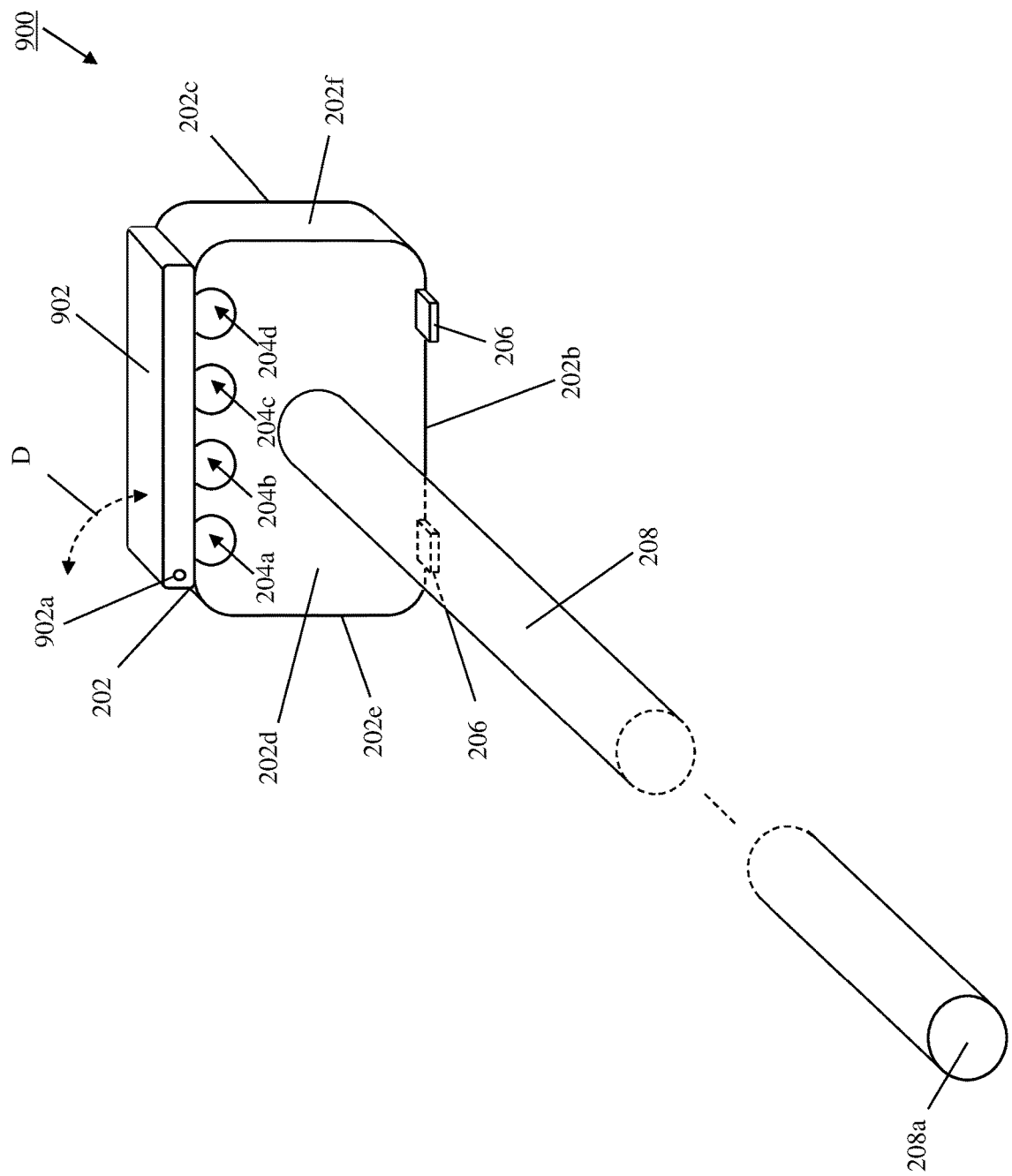
FIG. 9 is a perspective view illustrating an embodiment of a rack cable routing device provided according to the teachings of the present disclosure.

As discussed above, while a specific rack cable routing device 200 has been illustrated and described, the rack cable routing device of the present disclosure is envisioned as including a wide variety of components and/or component configurations that will fall within the scope of the present disclosure. For example, FIG. 9 illustrates an embodiment of a rack cable routing device 900 that is substantially similar to the rack cable routing device 200 discussed above with reference to FIGS. 2A and 2B, with similar elements provided with similar element numbers. However, the rack cable routing device 900 also includes a cable securing element 902 that includes a pivotal coupling 902a to the top surface 202a of the card securing base 202, with the cable securing element 902 configured to rotate about the pivotal coupling 902a and through an arc D between a cable securing orientation that is illustrated in FIG. 9 and that one of skill in the art in possession of the present disclosure will appreciate secures cables in the cable securing channels 204a-204d defined by the cable securing base 202, and a cable release/connecting orientation that allows cabled to be positioned in and removed from the cable securing channels 204a-204d defined by the cable securing base 202.

With reference to FIG. 10A, another embodiment of a rack cable routing device 1000 is illustrated that is substantially similar to the rack cable routing device 200 discussed above with reference to FIGS. 2A and 2B, with similar elements provided with similar element numbers. However, the rack cable routing device 1000 also includes cable identifiers provided on the front surface 202c of the cable securing base 202 adjacent each of the cable securing channels 204a-204d defined by the cable securing base 202, with the specific example provided in FIG. 10A including a "1" cable identifier located adjacent the cable securing channel 204a, a "2" cable identifier located adjacent the cable securing channel 204b, a "3" cable identifier located adjacent the cable securing channel 204c, and a "4" cable identifier located adjacent the cable securing channel 204d. Furthermore, the rack cable routing device 1000 also includes a light emitting device 1002 that is located on the front surface 202c of the cable securing base 202, and a light emitting device activator (not illustrated) may be located on the elongated handle 208 and/or anywhere else on the rack cable routing device 1000.

Figure 10B:
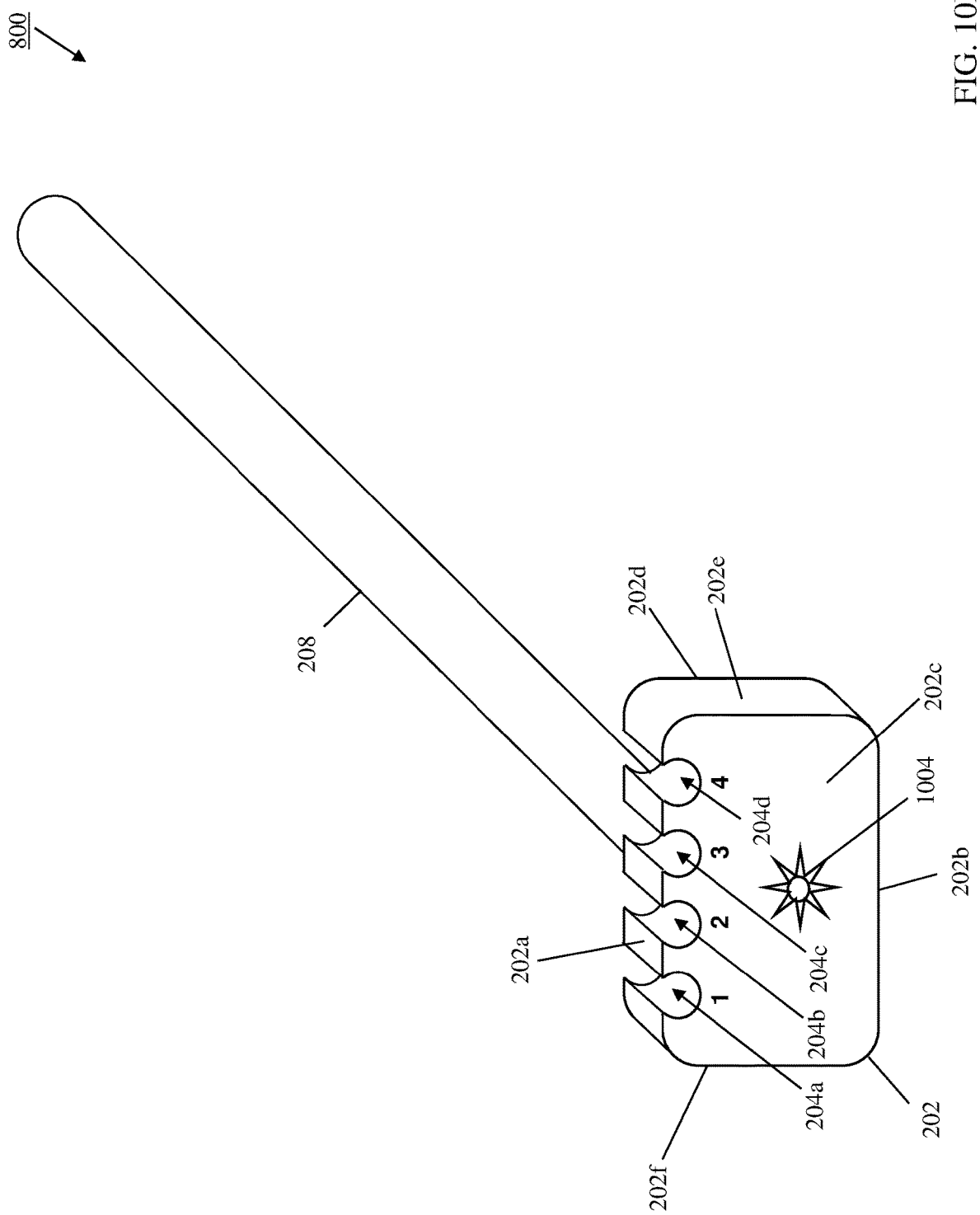
FIG. 10B is a perspective view illustrating an embodiment of the rack cable routing device of FIG. 10A operating during the method of FIG. 3.

As illustrated in FIG. 10B, and as will be appreciated by one of skill in the art in possession of the present disclosure, the light emitting device activator (e.g., a button on the elongated handle 208 of the rack cable routing device 200) may be activated when the rack cable routing device 200 is used in a rack with obstructed visibility (e.g., due to cabling and/or computing devices blocking ambient light) in order to cause the light emitting device to emit light 1004, thus allowing the rack cable routing device 1000 to illuminate the space in the rack through which is moved. However, while a few specific examples have been provided of additional features that may be included on the rack cable routing device of the present disclosure, one of skill in the art in possession of the present disclosure will appreciate how a variety of other features may be included on the rack cable routing device while remaining within the scope of the present disclosure as well.

Thus, systems and methods have been described that provide a rack cable routing device that secures cables to one of its ends while allowing its other end to be utilized to push those cables through a rack from a first side of the rack to a second side of the rack, with the rack cable routing device holding the cables in place on the second side of the rack so that they may be unsecured from the rack cable routing device and connected to computing devices in the rack. For example, the rack cable routing device of the present disclosure may include a cable securing base that includes cable securing element(s) that are configured to secure cable(s) to the cable securing base. The rack cable routing device also includes an elongated handle that extends from the cable securing base and that includes an elongated handle distal end that is opposite the elongated handle from the cable securing base. When cable(s) are secured to the cable securing base, the elongated handle may be moved into a computing device rack from a first side of the computing device rack such that the cable securing base is located adjacent a second side of the computing device rack that is opposite the computing device rack from the first side of the computing device rack while the elongated handle distal end of the elongated handle is located adjacent the first side of the computing device rack. As such, a single cabling technician may route cables through a rack without the issues associated with conventional rack cable routing techniques.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack cable routing device, comprising:
   a cable securing base that includes at least one cable securing element that is configured to:
      secure, to the cable securing base, one or more cables that each include a cable connector that is not connected to a computing device; and
   an elongated handle that extends from the cable securing base and that includes an elongated handle distal end that is opposite the elongated handle from the cable securing base, wherein the elongated handle is configured, while the one or more cables are secured to the cable securing base, to:
      position, in response to a user engaging the elongated handle distal end to position the elongated handle, the cable securing base adjacent a first side of a computing device rack; and
      move, in response to a user engaging the elongated handle distal end to move the elongated handle, through the computing device rack from the first side of the computing device rack such that the cable securing base is located adjacent a second side of the computing device rack that is opposite the computing device rack from the first side of the computing device rack while the elongated handle distal end of the elongated handle is located adjacent the first side of the computing device rack, wherein the cable securing base is configured, when located adjacent the second side of the computing device rack, to:
         release each cable connector included on the one or more cables secured to the cable securing base for connection to at least one computing device that is included in the computing device rack.

2. The rack cable routing device of claim 1, wherein the at least one cable securing element includes at least one cable securing channel that is defined by the cable securing base and that is configured to house the at least one cable to secure the at least one cable to the cable securing base.

3. The rack cable routing device of claim 1, further comprising:
   at least one retaining member that is included on the cable securing base and that is configured to engage a computing device in the computing device rack to prevent movement of the cable securing base towards the first side of the computing device rack.

4. The rack cable routing device of claim 3, wherein the at least one retaining member is resiliently biased into a non-retaining orientation and configured to be moved into a retaining orientation that prevents movement of the cable securing base towards the first side of the computing device rack in response to engagement with computing device in the computing device rack.

5. The rack cable routing device of claim 1, wherein the elongated handle is configured to adjust in length.

6. The rack cable routing device of claim 1, wherein a plurality of cable securing elements are included on the cable securing base, and wherein a respective cable identifier is located adjacent each of the plurality of cable securing elements.

7. An Information Handling System (IHS), comprising:
   a computing device rack that includes a first side and a second side that is opposite the computing device rack from the first side;
   a plurality of computing devices that are positioned in the computing device rack; and
   a rack cable routing device that includes:
      a cable securing base that includes at least one cable securing element that is configured to:
         secure, to the cable securing base, one or more cables that each include a cable connector that is not connected to the plurality of computing devices; and
      an elongated handle that extends from the cable securing base and that includes an elongated handle distal end that is opposite the elongated handle from the cable securing base, wherein the elongated handle is configured, while the one or more cables is are secured to the cable securing base, to:
         position, in response to a user engaging the elongated handle distal end to position the elongated handle, the cable securing base adjacent the first side of the computing device rack; and
         move, in response to a user engaging the elongated handle distal end to move the elongated handle, through the computing device rack from the first side of the computing device rack such that the cable securing base is located adjacent the second side of the computing device rack while the elongated handle distal end of the elongated handle is located adjacent the first side of the computing device rack, wherein the cable securing base is configured, when located adjacent the second side of the computing device rack, to:
            release each cable connector included on the one or more cables secured to the cable securing base for connection to at least one of the plurality of computing devices.

8. The IHS of claim 7, wherein the at least one cable securing element includes at least one cable securing channel that is defined by the cable securing base and that is configured to house the at least one cable to secure the at least one cable to the cable securing base.

9. The IHS of claim 7, further comprising:
at least one retaining member that is included on the cable securing base and that is configured to engage one of the plurality of computing devices in the computing device rack to prevent movement of the cable securing base towards the first side of the computing device rack.

10. The IHS of claim 9, wherein the at least one retaining member is resiliently biased into a non-retaining orientation and configured to be moved into a retaining orientation that prevents movement of the cable securing base towards the first side of the computing device rack in response to engagement with one of the plurality of computing devices in the computing device rack.

11. The IHS of claim 7, wherein the elongated handle is configured to adjust in length.

12. The IHS of claim 7, wherein a plurality of cable securing elements are included on the cable securing base, and wherein a respective cable identifier is located adjacent each of the plurality of cable securing elements.

13. The IHS of claim 7, further comprising:
a light emitting device that is included on the cable securing base.

14. A method for routing cables through a computing device rack, comprising:
securing, to a cable securing base of a rack cable routing device by at least one cable securing element that is included on the cable securing base, one or more cables that each include a cable connector that is not connected to a computing device;
positioning, by an elongated handle that extends from the cable securing base and that includes an elongated handle distal end that is opposite the elongated handle from the cable securing base in response to a user engaging the elongated handle distal end to position the elongated handle, the cable securing base adjacent a first side of a computing device rack;
moving, by the elongated handle in response to a user engaging the elongated handle distal end to move the elongated handle, through the computing device rack from the first side of the computing device rack such that the cable securing base is located adjacent a second side of the computing device rack that is opposite the computing device rack from the first side of the computing device rack while the elongated handle distal end of the elongated handle is located adjacent the first side of the computing device rack; and
releasing, by the at least one cable securing element included on the cable securing base, each cable connector included on the one or more cables secured to the cable securing base for connection to at least one computing device that is included in the computing device rack.

15. The method of claim 14, wherein the at least one cable securing element includes at least one cable securing channel that is defined by the cable securing base and that houses the at least one cable to secure the at least one cable to the cable securing base.

16. The method of claim 14, further comprising:
engaging, by at least one retaining member that is included on the cable securing base, a computing device that is included in the computing device rack to prevent movement of the cable securing base towards the first side of the computing device rack.

17. The method of claim 16, wherein the at least one retaining member is resiliently biased into a non-retaining orientation and moves into a retaining orientation that prevents movement of the cable securing base towards the first side of the computing device rack in response to engagement with the computing device that is included in the computing device rack.

18. The method of claim 14, further comprising:
adjusting, by the elongated handle, in length.

19. The method of claim 14, wherein a plurality of cable securing elements are included on the cable securing base, and wherein a respective cable identifier is located adjacent each of the plurality of cable securing elements.

20. The method of claim 14, further comprising:
emitting, by a light emitting device that is included on the cable securing base, light.

* * * * *